US010704167B2

(12) United States Patent
Sorin et al.

(10) Patent No.: US 10,704,167 B2
(45) Date of Patent: Jul. 7, 2020

(54) FABRICATION METHOD OF FUNCTIONAL MICRO/NANO STRUCTURES OVER LARGE-AREA, FLEXIBLE AND HIGH CURVATURE SURFACES, BY DRAWING A FIBER FROM A PREFORM

(71) Applicant: ECOLE POLYTECHNIQUE FEDERALE DE LAUSANNE (EPFL), Lausanne (CH)

(72) Inventors: Fabien Sorin, Saint-Sulpice (CH); Tung Dang Nguyen, Ecublens (CH); Yunpeng Qu, Lausanne (CH); Alexis Page, Renens (CH); Wei Yan, Echandens-Denges (CH)

(73) Assignee: ECOLE POLYTECHNIQUE FEDERALE DE LAUSANNE (EPFL), Lausanne (CH)

( * ) Notice: Subject to any disclaimer, the term of this patent is extended or adjusted under 35 U.S.C. 154(b) by 0 days.

(21) Appl. No.: 15/775,844

(22) PCT Filed: Nov. 21, 2016

(86) PCT No.: PCT/EP2016/078341
§ 371 (c)(1),
(2) Date: May 14, 2018

(87) PCT Pub. No.: WO2017/085323
PCT Pub. Date: May 26, 2017

(65) Prior Publication Data
US 2018/0327931 A1 Nov. 15, 2018

(30) Foreign Application Priority Data

Nov. 20, 2015 (EP) .................................... 15195707

(51) Int. Cl.
*D01D 5/253* (2006.01)
*B29C 55/02* (2006.01)
(Continued)

(52) U.S. Cl.
CPC ........... *D01D 5/253* (2013.01); *B29C 55/026* (2013.01); *B81C 1/0019* (2013.01); *D01D 5/00* (2013.01);
(Continued)

(58) Field of Classification Search
CPC ....... H01L 21/02019; H01L 21/30604–30621; H01L 21/3063–30635;
(Continued)

(56) References Cited

U.S. PATENT DOCUMENTS 3,659,915 A   5/1972   Maurer et al.
4,504,300 A   3/1985   Gauthier et al.
(Continued)

FOREIGN PATENT DOCUMENTS

JP    H0274667 A      3/1990
WO    WO/2008/057431  5/2008

OTHER PUBLICATIONS

Abouraddy et al., "Towards multimaterial multifunctional fibres that see, hear, sense and communicate," Nature Materials, vol. 6, No. 5, pp. 336-347, 2007.
(Continued)

*Primary Examiner* — Shahed Ahmed
(74) *Attorney, Agent, or Firm* — Andre Roland S.A.; Nikolaus Schibli

(57) ABSTRACT

The method for drawing a fiber with a textured surface comprises the following steps: —forming of a preform from which the fiber is to be drawn with a textured surface; —addition of an outer layer to the textured preform to preserve the shape of the texture of the preform surface during the drawing operation; —drawing of a fiber from the preform, whereby the fiber keeps the formed texture of the preform surface and —removing the additional outer layer to leave the original surface textured fiber exposed. The
(Continued)

obtained fiber can be used as a mold to form a textured hollow channel in another material, as a surface coating and as a pressure detector.

19 Claims, 8 Drawing Sheets

(51) Int. Cl.
| | | |
|---|---|---|
| *G01L 1/20* | (2006.01) | |
| *B81C 1/00* | (2006.01) | |
| *G01L 11/02* | (2006.01) | |
| *G01L 1/24* | (2006.01) | |
| *D01D 5/00* | (2006.01) | |

(52) U.S. Cl.
CPC ............... *G01L 1/20* (2013.01); *G01L 1/242* (2013.01); *G01L 11/025* (2013.01); *B81B 2201/0264* (2013.01)

(58) Field of Classification Search
CPC .......................... H01L 21/3065–30655; H01L 21/31055–31056; H01L 21/31111–31122; H01L 21/31133–31138; H01L 21/32133–32139; H01L 21/465; H01L 33/0095; H01L 31/186–1872; F27B 17/0025; D01D 5/253; D01D 5/00; B29C 55/026; B81C 1/0019; G01L 1/20; G01L 1/242; G01L 11/025; B81B 2201/0264
See application file for complete search history.

(56) References Cited

U.S. PATENT DOCUMENTS

| | | | | |
|---|---|---|---|---|
| 5,984,747 | A * | 11/1999 | Bhagavatula | ......... C03B 37/026 |
| | | | | 313/582 |
| 2003/0001082 | A1 * | 1/2003 | Duncan | ..................... G01J 3/02 |
| | | | | 250/231.19 |
| 2005/0286847 | A1 * | 12/2005 | Arimondi | ............... B29C 55/00 |
| | | | | 385/123 |
| 2010/0290781 | A1 * | 11/2010 | Overton | ................ C03C 13/046 |
| | | | | 398/43 |
| 2011/0123162 | A1 * | 5/2011 | Molin | .................. G02B 6/0288 |
| | | | | 385/124 |
| 2012/0027987 | A1 * | 2/2012 | Poulakis | .............. H05K 9/0067 |
| | | | | 428/100 |
| 2012/0301093 | A1 * | 11/2012 | Sillard | ............... G02B 6/03666 |
| | | | | 385/126 |
| 2013/0202888 | A1 * | 8/2013 | Abouraddy | ............... B29B 9/00 |
| | | | | 428/372 |
| 2016/0270388 | A1 * | 9/2016 | Lai | ........................ A01N 1/0242 |
| 2018/0003859 | A1 * | 1/2018 | Morasse | ............ G02B 6/02061 |
| 2018/0088258 | A1 * | 3/2018 | Yamamoto | ............ B29C 33/424 |

OTHER PUBLICATIONS

Alexander Schmidt et al., "Hybrid Optical Fibers—An Innovative Platform for In-Fiber Photonic Devices," Advanced Optical Materials, vol. 4, No. 1, pp. 13-36, 2016.

Banaei, E.H. et al., "Design of a polymer optical fiber luminescent solar concentrator," Progress in Photovoltaics: Research and Applications, vol. 23, No. 4, pp. 403-416, 2015.

International Search Report dated Apr. 13, 2017 for PCT/EP2016/078341.

Kao, K.C. et al., "Dielectric-fibre surface waveguides for optical frequencies," IEE Proceedings J (Optoelectronics), 133(3), 1986, pp. 191-198.

Russell, P., "Photonic crystal fibers," Science, vol. 299, No. 5605, pp. 358-362, 2003.

Written Opinion of the International Search Authority for PCT/EP2016/078341 dated Apr. 13, 2017.

Yildirim et al., "Surface textured polymer fibers for microfluidics," Advanced Functional Materials, vol. 24, No. 29, pp. 4569-4576, 2014.

* cited by examiner

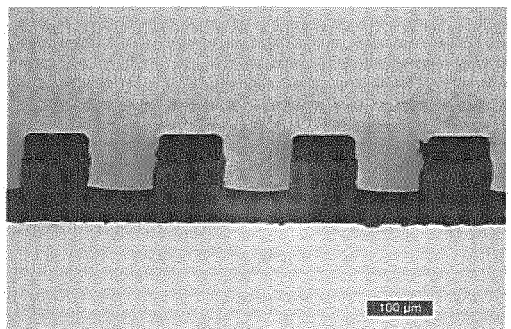
100 μm on PSu
FIGURE 3
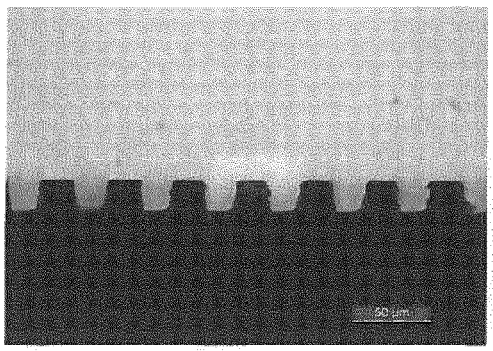
20 μm on PC
FIGURE 4A
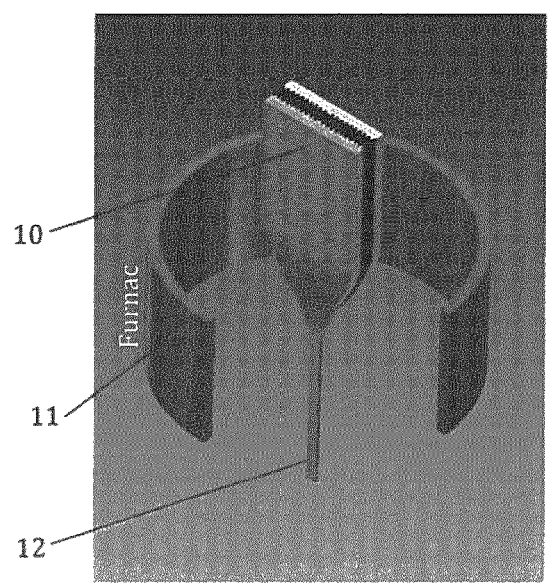
FIGURE 4B
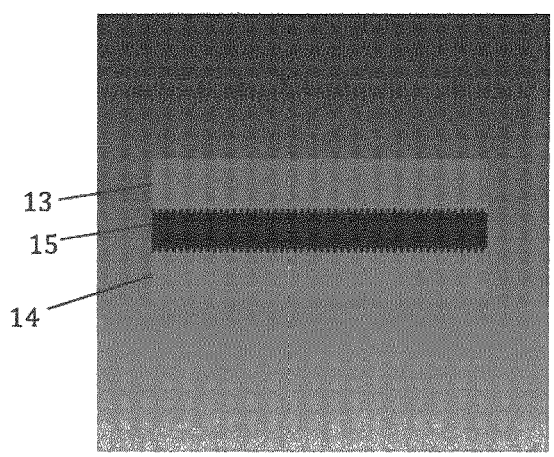
FIGURE 4C
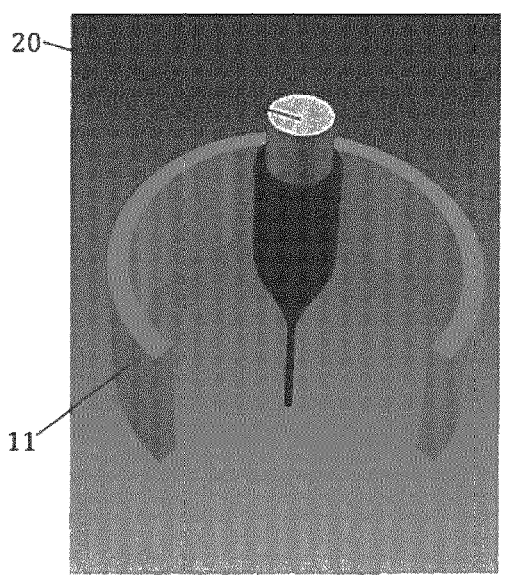
Figure 4D
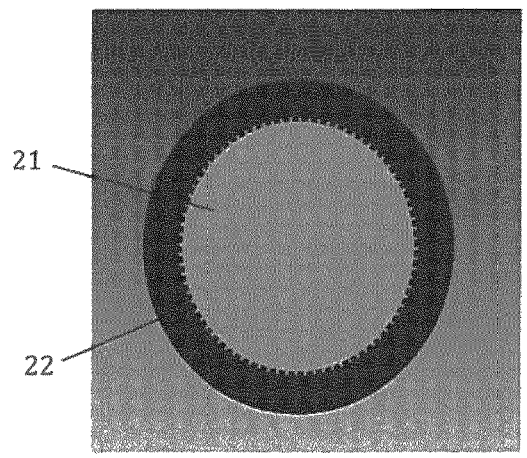

PC preform: $\theta = 74°$

Assembled textured PC fiber: $\theta = 103°$

FABRICATION METHOD OF FUNCTIONAL MICRO/NANO STRUCTURES OVER LARGE-AREA, FLEXIBLE AND HIGH CURVATURE SURFACES, BY DRAWING A FIBER FROM A PREFORM

CROSS REFERENCE TO RELATED APPLICATIONS

The present application is a United States national stage application of PCT/EP2016/078341 filed on Nov. 21, 2016 designating the United States, and claims foreign priority to earlier European application No 15195707.3, filed on Nov. 20, 2015, the content of both of these applications being incorporated in their entirety by reference in the present application.

FIELD AND SUMMARY OF THE INVENTION

Many surface properties of materials can be tailored by a proper physical texturing. Such patterning can be exploited for light trapping in advanced photovoltaic systems, to tailor the hydrophobicity of surfaces, to enable the preferential positioning and growth of biological cells, or to generate turbulences in confined micro and nanofluidic channels.

All these examples require however to fabricate such patterns over large-area substrates, over flexible surfaces with small curvature radii, or even within confined 3D hollow cavities. While the advancement of wafer-based techniques has enabled the fabrication of high quality nano-structures, it remains very challenging to achieve the same level of quality beyond small, flat and rigid Silicon substrates.

The present invention proposes a novel and scalable approach to the fabrication of sub-micrometer patterning of large-area, flexible and curved surfaces, as well as within PDMS—or other material-channels. It also allows the structuring of functional materials such as electrically conductive materials, that can be mechanically actuated to perform a given functionality, here exemplified by touch sensing. The approach followed relies on the preform-to-fiber thermal drawing technique, similar to the technique used for the fabrication of optical fibers for example.

The method according to the present invention comprises first the fabricating of the desired structure at the sub-millimeter to a few micrometers level onto a macroscopic thermoplastic rod or plate. In a second time, the textured preform is heated up above its glass transition temperature and deforms plastically at high viscosity into a long and thin fiber or ribbon. In order to avoid thermal reflow driven by surface tension (Laplace pressure), the desired texture is encapsulated within a second material (for example a polymer) with a low interfacial energy. This slows down drastically the velocity field induced by Laplace pressure, and enables to reach sub-micrometer feature sizes at the fiber level.

Preferably, this second material, e.g. polymer, is also chosen for its low adhesion properties, so that it can be removed mechanically post-drawing to leave the original polymer with the free textured surface. Solvent-based techniques for removal of the cladding could also be used or other equivalent methods. If the adhesion properties are sufficiently low, one the fiber is properly drawn the polymer outer material will detach itself directly because the contact surface will be too small to maintain adhesiveness between the materials.

To demonstrate the potential of the approach of the present invention, the present application describes as a non-limiting embodiment the ability to assemble textured ribbons into a flexible surface with enhanced hydrophobicity and optical properties. Secondly, the present application will present recent results on the growth of adipose-derived stem cells onto fibers with patterned surfaces, revealing the effect of the texture on the alignment and morphology of cells. The present invention describes embodiments of fibers with novel optical properties. Finally, the present application will describe embodiments where textures of high aspect ratio and made out of electrically conducting polymers could bend upon mechanical pressure and sense touch.

BACKGROUND OF THE INVENTION

The thermal drawing technique is the main technique that is used to fabricate optical fibers, see reference [1].

In the drawing process of the prior art, a large preform made of glass or polymer is fed into an enclosed furnace and heated over its glass transition temperature. As the viscosity decreases several orders of magnitude, the preform necks down under its own weight; when the lower end of the preform comes out of the furnace, it is attached to a pulling system, and the fiber is then continuously drawn. Fiber dimension, shape and internal stress are monitored during the process by optical sensor and tension sensor; and they are controlled by a set of drawing parameters, namely feeding speed (the speed at which the preform is fed into the furnace), drawing speed (the speed at which the fiber is pulled) and the furnace temperature. The principle of this technology is illustrated in FIG. 1.

Since the invention of low-loss optical fiber by Charles Kao see reference [1], which redefined the way of communication, the thermal drawing process has been a subject for intensive research and has become extremely efficient in term of scaling-down ratio and ease of processing. New generations of fibers have emerged, such as photonic crystal fibers see reference [2] or multimaterial fibers see reference [3], bringing thermally drawn fibers to a wide range of application from optics and electronics to microfluidics and bioengineering.

An important aspect of the thermal drawing process is that it inherently generates a surface area as the fiber is being stretched. This simple and low-cost processing approach is therefore an ideal way to create micro/nano textured surfaces over large and curved area, which is a key attribute in many fields of applied science such as energy storage and harvesting, health care, smart textiles or distributed sensing. This aspect, however, has surprisingly received few attentions. Recently, Banaei and Abrouraddy see reference [4] proposed a design in which the outside surface of a step-index optical fiber played a role for solar concentrator, with the curvature of the outside structure being of several hundreds of micrometer; while Yildirim et al see reference [5] created star-shape fiber with feature size as small as 30 microns, starting from a lathe-shaping 3 cm circular preform.

In both works, preforms were prepared by mechanical machining from a single material (polycarbonate in reference [4] and polyethylenimine in reference [5]), and the shape preservation was due solely to the intrinsic properties of the constituting polymers, based on previous observation.

However, the resulting application only comes from the texturing of the polymer, and not from functional properties that other polymers or polymer composites could exhibit. Moreover, to create even smaller structure (for example a sub-micron structure) on various polymers, the single-material preform-to-fiber drawing approach represents several limitations. Firstly, since fiber drawing requires annealing the preform above the glass transition temperature of the polymer constituents, this heating also results in a thermal reflow and smoothing of structured surface, and the smoothing happens faster as the structure's feature size gets smaller.

Secondly, even if the shape remains, making smaller feature-size structure on fiber from millimeter-size structure on preform could only be achieved by high draw-down-ratio, which either results in very small fibers that would be too weak to be drawn or too small for some applications, or requires a very large, sometimes impractical initial preform.

OVERVIEW OF THE INVENTION

An aim of the present invention is therefore to improve the known processes and methods, and the products that may be obtained by said processes and methods.

Another aim is also to propose novel fiber integrated devices that can perform functionalities that could not be achieved with previous configurations.

Another aim of the present invention is also to create a novel textured fiber architecture with functional polymers that acts as cantilever-like devices found in the MEMS technology.

Another aim of the present invention is to use textured fibers as molds to patterns other surfaces and systems, especially high curvature systems such as the inner walls of micro-channels.

A more precise aim of the proposed invention is to generate sub-micron pattern or patterns on flexible and large-area polymer surfaces, fibers of different shapes, and within channels of different materials, especially soft polymers such as PDMS. Another precise aim is to show the ability of pressure sensing from free-standing functional textures embedded along the entire fiber length.

To this effect, when compared to a conventional thermal drawing process of an optical fiber (e.g. as described in U.S. Pat. No. 3,659,915 A, see reference [6]) the present invention described herein is differentiated by at least the four novel following modifications and features:
1. A novel way to create textured preform using a combination of photolithography, hot-embossing and polymer casting.
2. The use of a polymer or polymer composite as a constituting part of the preform in order to reduce the thermal deformation of the texture subject to heating while being processed. The effect is triple:
   a. It interfaces with the textured material to lower the interfacial energy and hence the Laplace pressure, which slows down drastically the reflow and consequently enables to maintain the texture at the fiber level.
   b. It can also be thermally conductive (a conducting polymer composite for example) to manage better the temperature, and hence the viscosity, experienced by the texture during the draw;
   c. It can be removed post-drawing, either mechanically due to a poor adhesion to the textured polymer, or via orthogonal solvents.
3. The use of textured fibers as molds to form micro-channels with textured inner walls within polymers such as soft PDMS.
4. Cantilever-like textures integrated on thermally drawn fiber with electrically conducting polymers with a high aspect ratio. These polymers can bend upon a mechanical excitation and different parts of the texture touch each other to generate an electrical signal which is then used to sense pressure.

DETAILED DESCRIPTION OF THE INVENTION

Embodiments of the present invention are illustrated in the attached drawings which show FIG. 1 represents a bloc-diagram of an example of a thermal drawing process from a preform according to the prior art;

FIG. 3 illustrates examples of soft embossed polymer surfaces for preform texturing;

FIGS. 4A to 4D illustrate embodiments of the result of the process according to the present invention;

Figure 1:
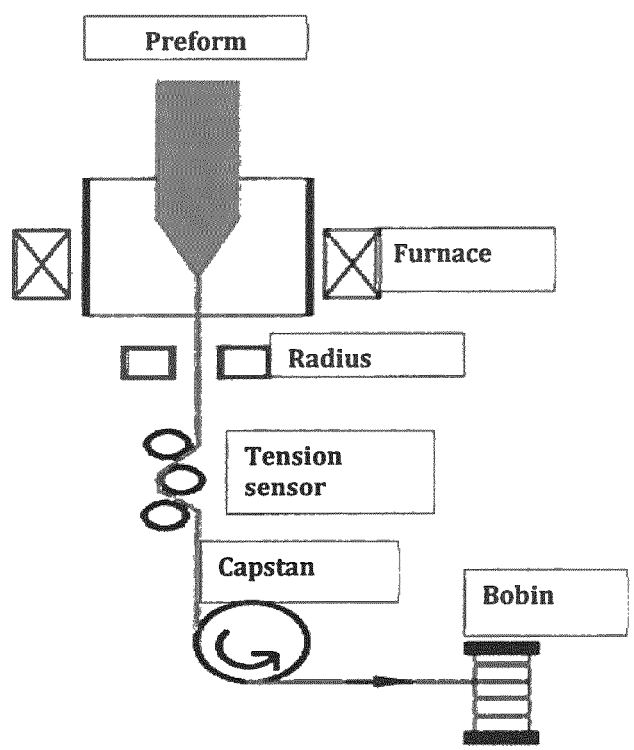

In order to create micro/nano textured fiber, an aspect of the present invention is first to create a texture on a preform, and drawing said textured preform into fiber in a way such that the shape of the texture is kept or maintained at fiber-level, but with dimension of orders of magnitude smaller.

Four key novel modifications compared to conventional approaches described in references (5) and (4) are proposed in some embodiments of the present invention:
   i) the making of textured surface at the preform level;
   ii) the use of an additional material, preferably a polymer, to maintain the formed texture at fiber level.
   iii) the simple mechanical or chemical removal of the additional material post-drawing that can be installed in-line with the drawing tower.
   iv) the texturing of functional polymers such as electrically conductive polymers that can perform prescribed functionalities.

Different embodiments and features of the invention are now described in detail.

In an embodiment, the invention concerns a method for drawing a fiber with a textured surface, wherein said method comprises the following steps:
   forming of a preform from which the fiber is to be drawn with a textured surface;

addition of an outer layer to the textured preform to preserve the shape of the texture of the preform surface during the drawing operation;

drawing of a fiber from the preform, whereby the fiber keeps the formed texture of the preform surface and removing the additional outer layer to leave the original surface textured fiber exposed.

In an embodiment, the step of removing the additional layer is made by a mechanical process or by chemical etching.

In an embodiment, the preform is textured using photolithography and/or hot-embossing and/or solution/film casting techniques.

In an embodiment, the preform is made of a polymer. The polymer forming the preform may be a polycarbonate, or PMMA, or Polysulfone.

In an embodiment, the polymer forming the preform may be a polymer composite.

In an embodiment, the outer layer is made of a polymer. The polymer forming the outer layer may be polyethylene or PMMA, or carbon-black filled polyethylene.

In an embodiment, the preform is rectangular or cylindrical in cross-section.

In an embodiment, the invention concerns a fiber manufactured by the method as defined herein.

In an embodiment, the invention concerns a product comprising at least a fiber as defined herein.

In an embodiment, the fiber may be used as a mold to form a textured hollow channel in another material.

In an embodiment, a network of fibers is used as a mold and leave behind after removal a 30 microfluidic architectures with channels of tailored shape and roughness in said other material.

In an embodiment, said other material is a soft polymer such as PDMS.

In an embodiment, the Invention concerns a product obtained by the method as defined herein.

In an embodiment, a plurality of fibers may be assembled to form a surface coating.

In an embodiment, the fiber may be used as a pressure detector.

In an embodiment, a fiber as defined herein comprises a free standing electrically conductive polymer composite film that bends under pressure and domains placed at defined positions on the fiber such that when the bent film contacts the domain, an electrical signal is generated that allows detection of the pressure localization along the fiber.

In an embodiment, the bending structure is a membrane that encloses the textured fiber; In an embodiment, the invention concerns a product comprising at least a fiber as defined herein.

1. Making Textured Surface

According to the present Invention, in an exemplary embodiment, one employs a combination of photolithography and hot-embossing and solution casting to create large-area texture on a rectangular preform and to create textured film for rolling into a circular preform. This principle is illustrated in the figures for example in FIGS. 2, 3 and 4. Typically, the sizes of the areas of the preform are around 3×20 cm square in the lab, 100×30 cm square in the optical fiber industry.

Larger scale textures may also be fabricated via drilling and milling machines, or by hot pressing with a sacrificial material like Teflon that is removed after the preform is consolidated (see FIG. 5a). The example of the pressure sensing fiber described in detail below with conducting polymers is an example of such approach.

Photolithography, hot-embossing or film casting techniques are well-known processes per se, however, there was no evidence in the state-of-the-art that the above-mentioned techniques could be employed for preform making for subsequent fiber drawing. Of course other equivalent methods may be used in the frame of the present invention to realize the large area texture on the preform.

Figure 2:
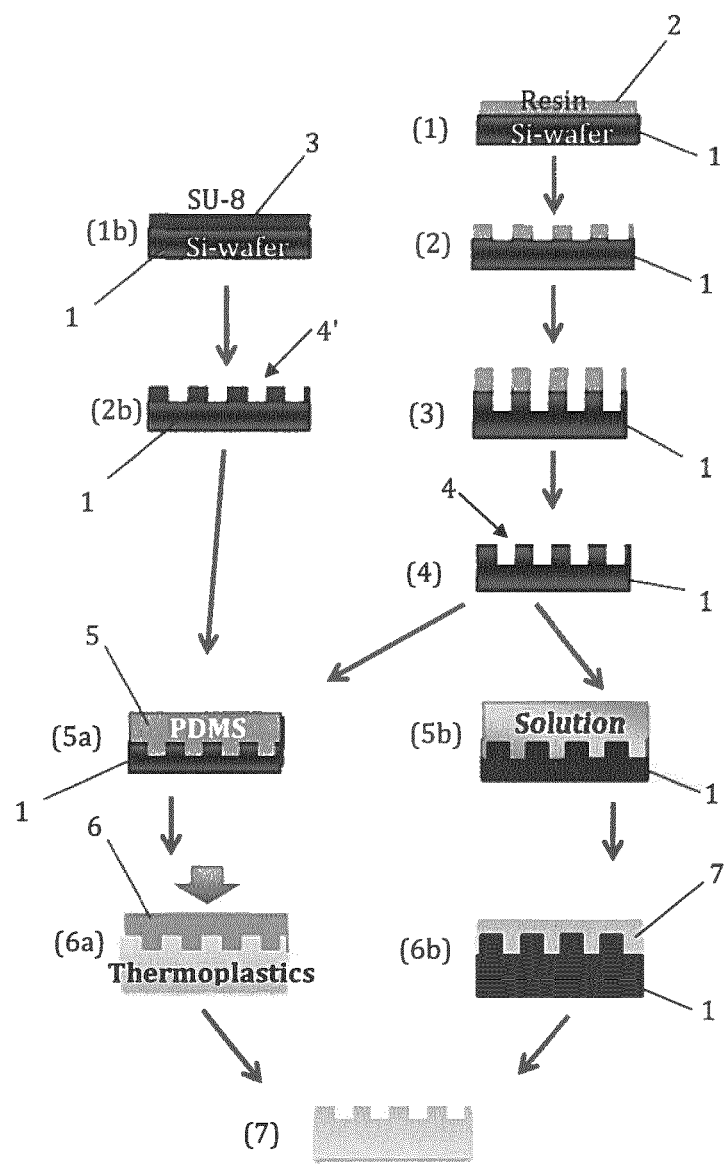
FIG. 2 illustrates an example of a method to fabricate a textured preform according to the present invention.

FIG. 2 illustrates the basic principle of the process according to the invention, namely the method to fabricate a textured preform, with the following steps:

Step (1) spin coating of photoresist 2 on a silicon wafer 1,
Step (2) photolithography of desired texture 4,
Step (3) plasma etching,
Step (4) photoresist stripping,
Alternatively the following steps may be followed
Step (1b) SU-8 spin-coating 3,
Step (2b) photolithography and developing to obtain the desired texture 4'.

Then once steps (4) or (2b) above have been reached, the following steps are followed Step (5a) PDMS casting on a textured Si wafer 1,
Step (6a) hot-embossing of textured PDMS on thermoplastics (film or plate),
Or alternatively
Steps (5b) and (6b) casting of thin thermoplastic film on a textured Si wafer 1;
Then the following step is carried out:
Step (7) final textured thermoplastics (film or plate) is formed.

According to the present invention, desired patterns can first be created on a Silicon surface 1 using photolithography, either using photoresist and plasma etching see FIG. 2, steps (1) to (4) or using a SU-8 see FIG. 2, steps (1b) and (2b).

The pattern 4, 4' on the Si wafer 1 or the SU-8 3 is then transferred to a PDMS mold 5 using PDMS casting see FIG. 2, step (5a), then from this PDMS mold 5 to thermoplastics plates or films 6 by hot-embossing see FIG. 2, step (6a).

Another method to transfer the pattern to a thermoplastic surface is by casting solvent of the thermoplastics directly on the Si wafer 1 see FIG. 2, steps (5b) and (6b) in order to create textured film 7. Note that the method of casting directly thermoplastics on Si-wafer 1 cannot always be applied on SU-8 structure, because the solvent can attack the SU-8 and destroy the pattern.

The detailed parameters for making patterns on polycarbonate as an example of the process described above are discussed now. Photolithography and casting of PDMS are well known processes. The specific parameters for polycarbonate presented in the following are for hot-embossing and for polymer casting:

Hot-embossing of PDMS on polycarbonate plate or film are conducted at 170° C. and at pressure of 0.1 mbar for 5 minutes. These parameters are chosen considering that PDMS can be processed at 200° C.; and glass transition temperature of polycarbonate is 140° C. The embossed polycarbonate plate/film resulted from this process are shown in the FIG. 3.

For polycarbonate casting, we first prepared a solution of polycarbonate (PC) in tetrahydrofuran (TH F). The concentration of the solution is adjusted according to the desire thickness, for example, to make PC film 200 μm, the concentration is 0.3 mol/L; and 500 ml of this solution was poured on a leveled surface of about 25 cm$^2$.

2. Design of Textured Preform with an Additional Interfacing Polymer for Forming Nano-Scale Textures It was observed in experiments that when a textured preform created by the process described above was processed using thermal drawing (as described in section 1 above), the structure of the texture disappeared due to thermal deformation. It was understood that the driving force of the deformation was the surface tension on the free surface of the polymer. This surface force was proportional to the surface tension, and inversely proportional to the feature size of the structure, so that it was much more difficult to keep the structure shape at small feature size such as several micro-meter of sub-micron meter, compared to millimeter size realized in references [4][5]. In addition, the viscous force which countered the deformation was proportional to the material's viscosity, which decreased several orders of magnitude when the material was heated up inside the furnace.

Accordingly, in order to preserve the shape of the structure, the present invention proposes a new design and method in which an additional layer, preferably a polymer, is included to interface with the texture. The proposed designs for rectangular, cylindrical, or any cross-sectional shape preforms are shown in FIGS. 4A and 4C. The use of thermal conducting polymer composites has several advantages:

i. The driving force of the deformation is now inversely proportional to the interfacial tension between two polymers. This interfacial tension is much smaller than the surface tension of a free polymer surface, as a consequence the driving force was reduced.

ii. The potential high thermal conductivity of a polymer composite could also lead to lower temperature at the interface of the two polymers. The lower local temperature of the interface in turn leads to a higher viscosity of the polymer around the interface, hence a higher counter force to the deformation.

iii. The composite could play a role of a rigid wall, and could add an additional term to the counter force to the deformation.

The principle of the present invention may work with any couple of polymers that satisfy any of the following conditions:

the polymers can be co-drawn with thermal drawing technique, and can be separated mechanically from each other at fiber level. This necessitate a compatible thermal drawing temperature and a low adhesion between the polymers for simple post-drawing separation. The adhesion should be high enough so that the two materials stick together during processing, but low enough to be separated in the fiber form. Note that in the fiber form, the adhesion area is reduced, which in turn lowers the total adhesion force between the two polymers. An example of a possible couple of polymers are Polyethylene doped with carbon black particles as the sacrificial (i.e. additional) layer, and polycarbonate, PMMA, Polysulfone . . . different thermoplastic for the other layer.

the polymers can be co-drawn with the thermal drawing technique, and can subsequently be separated chemically from each other at the fiber level by simple peeling off or by using an orthogonal solvent that dissolves the sacrificed external layer but not the layer that has the structure. A typical example is a couple PMMA (polymethylmethacrylate) and PC (polycarbonate).

These are only non-limiting examples and other couples of polymers and materials are possible in the frame of the present invention.

FIG. 4A illustrates schematically a flat preform 10 in a furnace 11, said preform 10 being drawn to form a flat fiber 12 in accordance with the methods described above. The flat fiber 12 is illustrated in cut view in FIG. 4B and it comprises several layers 13, 14 and 15. Both layers 13 and 14 are for example a polymer and the layer 15 between the two layers 13 and 14 is the additional layer used to keep the texture as described herein in accordance with the principle of the present invention.

In this FIG. 4A, the different layers of the preform may be assembled by hot-pressing for example or another equivalent method. The hot-press temperature and pressure is chosen so that the sacrificed layer can have a viscosity low enough to fill the structure; but also that the pattern is not destroyed by thermal deformation.

In FIGS. 4C and 4D, a cylindrical configuration of the fiber preform 20 is illustrated in a furnace 11. The drawn fiber is illustrated in FIG. 4D with the "inner" polymer 21 being textured and the additional polymer 22 being used to maintain the texture on the fiber, in accordance with the principle of the present invention.

In FIG. 4C the illustrated preform is created by starting with texturing a thin (between around 20 and 200 micrometer thick) polymer film with a given structure via hot embossing. This textured film is then rolled manually (or machines could do it) around a polymer rod 21. The sacrificed polymer film or layer 22 is then rolled around this assembly and this preform 20 is then consolidated in a hot oven under vacuum. The temperature again is chosen so that the sacrificial polymer layer 22 gets at low viscosity and fills in the structure well.

It is important to choose a polymer or polymer composite (for example 15 or 22, as in FIGS. 4B and 4D) which can be co-processed with the polymer of the structure (for example 14, 14 or 21, as in FIGS. 4B and 4D).

On the other hand, it is equally important that the additional polymer is chosen so that the detachment of different component of the fiber can be done with ease. In order to satisfy these requirements, when wanting to create a textured fiber of a certain polymer, one will preferably choose a polymer or polymer composite whose polymer matrix is immiscible to the of the fiber, and the filler is made of thermal conducting material such as carbon-black, carbon nanotubes or steel fiber.

FIGS. 4A to 4D illustrate an example of making a preform for polycarbonate fiber making. The employed composite 15/22 is carbon-black-filled polyethylene (cPE). Polyethylene and polycarbonate are not miscible, and the thermal conductivity of the composite polymer is much higher than that of fiber polymer. The structures of a rectangular preform and a circular preform are shown in FIGS. 4B and 4D. Other materials are possible, in addition to the one described herein.

Figure 5:
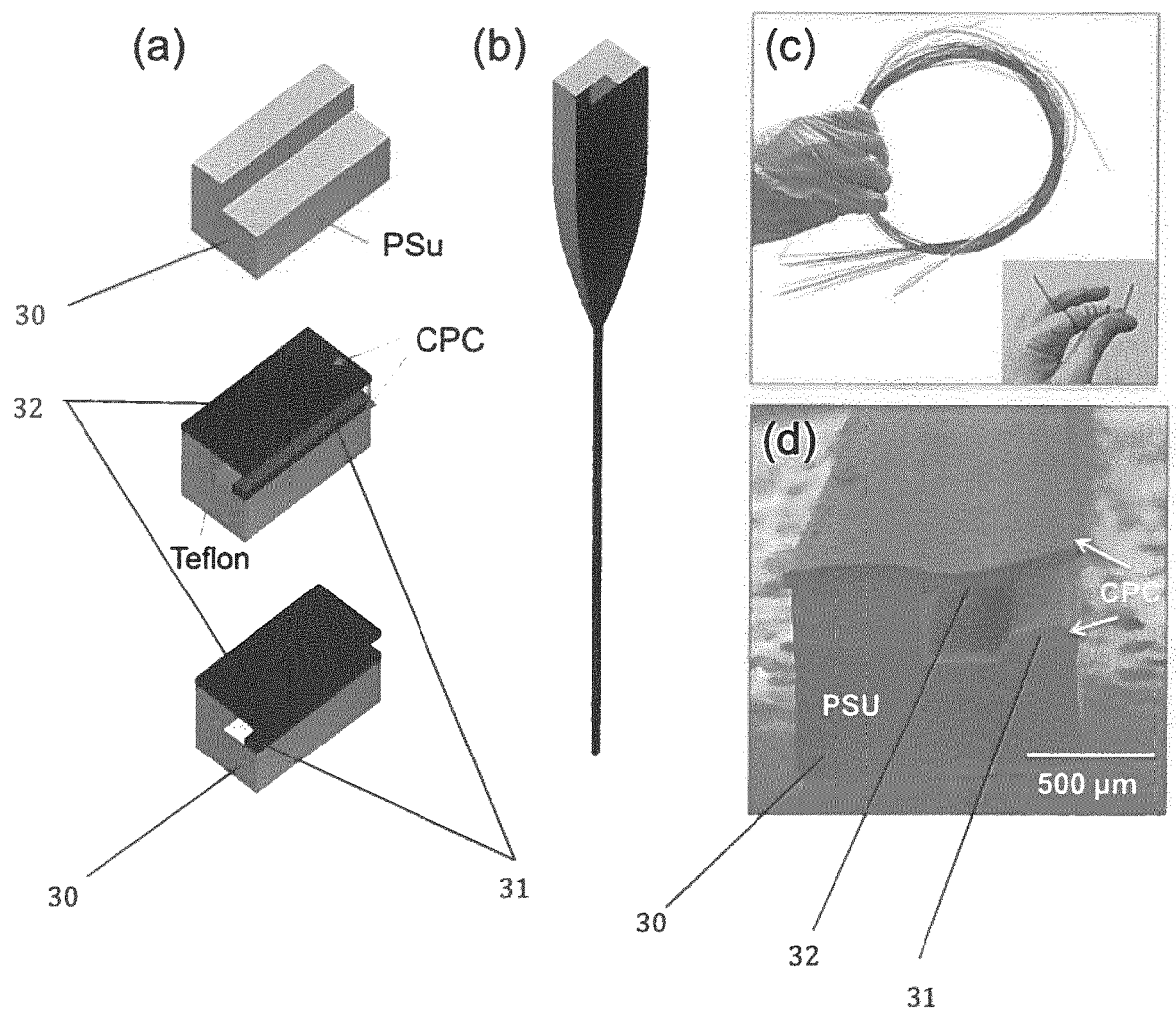
FIG. 5 shows diagrams of the thermal drawing process to fabricate fibers with electrically conducting polymers that can be actuated to sense, for example, touch.

FIG. 5 also illustrate another way to make a textured preform with functional materials. We start by machining a thermoplastic plate in a L-shape cross-sectional structure 30 (FIG. 5a). For the conducting material that will deliver the desired electronic function, we choose a conducting polymer composite such as a carbon black loaded polycarbonate (CPC) composite. A CPC bus 31 is placed on the long edge of the L-shaped PSU, while a thin CPC sheet 32 is positioned above it on the short edge as shown in FIG. 5a. A Teflon plate, or another material that has low adhesion with other preform constituents, is at the same time machined and positioned so as to support both CPC domains during their hot pressing against the PSU construct to fabricate the preform. Hot pressing is performed in vacuum and at a temperature of 220° C. in a laboratory press. This temperature is chosen according to the softening point of PSU and CPC, and can be varied.

After the preform is consolidated, the Teflon part is mechanically removed (FIG. 5a). The assembly is subsequently thermally drawn in a custom-made draw tower at a set temperature that enables the co-drawing of all constituents (here 260° C. for PSU and CPC, FIG. 5b). Feeding speeds of 1 mm/min and drawing speed between 0.1 m/min and 1 m/min were used. As shown in FIGS. 5b, 5c and 5d the thermal drawing results in extended length of flexible ribbons that maintain the exact cross-sectional shape of the initial preform. Note that other configurations could be obtained, in particular a structure where a membrane enclosing the fiber core could be made thin enough 3. Making Textured Fiber by Thermal Drawing Process Preforms created by the above-mentioned processes are drawn into fiber to create textured fiber. Conventional drawing methods are used, with temperature above the Tg of the preform constituents.

According to the principles of the present invention, texture on the preform remains in its shape at fiber level, but with a size decrease of one or several order of magnitudes.

Figure 6:
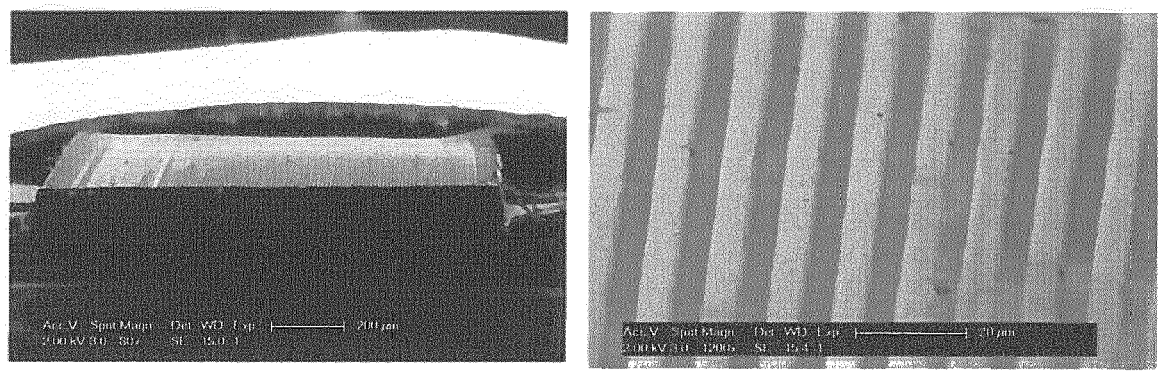
FIG. 6 illustrates examples of textured fiber with feature size of 5 m (left) with a perspective view and (right) a zoomed view of the surface.
Figure 7:
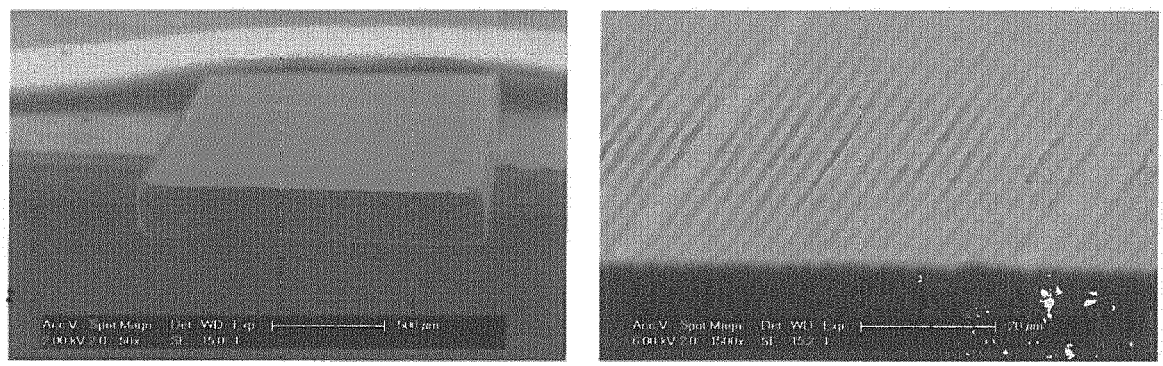
FIG. 7 illustrates examples of textured fiber with feature size of 5 µm (left) with a perspective view and (right) a zoomed view of the surface.
Figure 8:
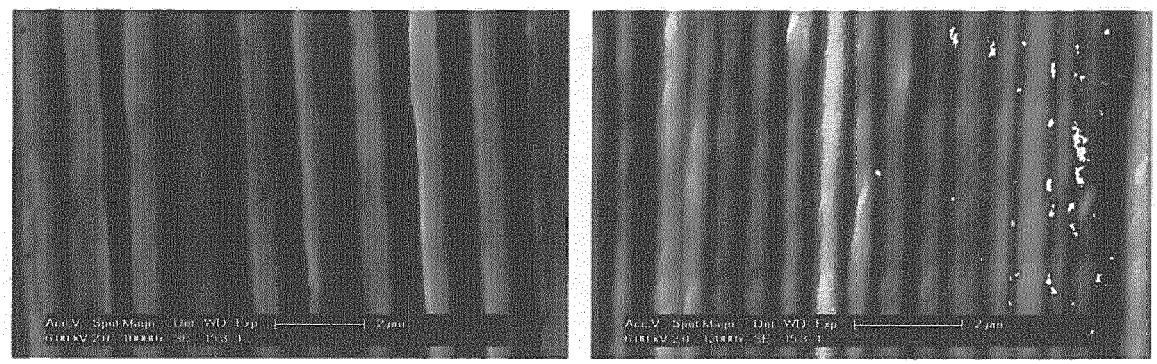
FIG. 8 illustrates examples of textured fibers with: (left) 500 nm feature size and (right) 300 nm feature size.

FIGS. 6, 7 and 8 reproduce concrete images of textured fibers with a texture of several sizes on rectangular fibers and circular fibers as examples of realizations/embodiments.

More precisely, FIG. 6 illustrates examples of textured fiber with feature size of 5 µm (left) with a perspective view and (right) a zoomed view of the surface;

FIG. 7 illustrates examples of textured fiber with feature size of 5 µm (left) with a perspective view and (right) a zoomed view of the surface;

and FIG. 8 illustrates examples of textured fibers with: (left) 500 nm feature size and (right) 300 nm feature size;

4. Making Textured Hollow Channels

The textured fibers can also be used as molds to transfer their micrometer and sub-micrometer textures to the inner walls of micro-channels. For example, a PDMS solution can be poured onto a PMMA textured fiber and after reticulation, the PMMA fibre can be mechanically removed or chemically etched by acetone. This leaves a hollow channel with the shape of the fiber's cross-section inside the PDMS solid. Complex shapes with small textures can then be achieved, and complex 3D Microchannels constructs can in that way be realized by assembling fibers together.

Figure 9:
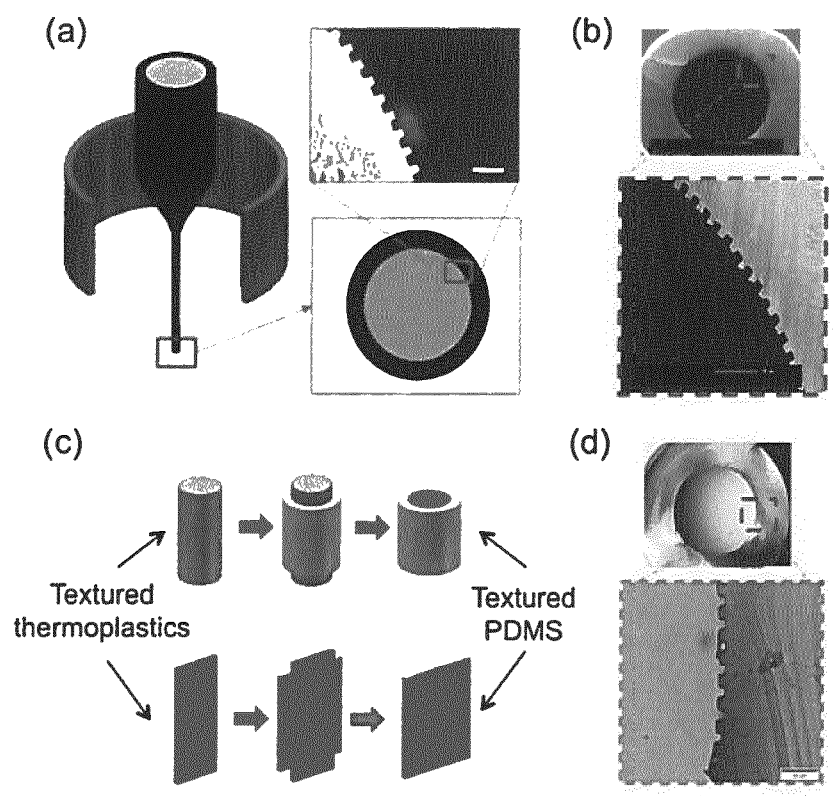
FIG. 9 illustrates an example of a fabrication approach for manufacturing textured hollow channels.

FIG. 9 illustrates this fabrication approach. I FIGS. 9a and 9b, a preform to fiber schematic of a circular fiber and related micrographs show how texture can be imparted to cylindrical fibers. In FIGS. 9c and 9d we show the principle of transferring the texture from a flat or cylindrical (or any shape) fiber onto a soft polymer such as PDMS.

I. Potential Applications

The textured fibers can be employed in wide range of applications in optoelectronics, optics, textile industry, biology etc. In this section, three proofs of concept applications are presented in unconventional large-area surface coating, optoelectronics and biology as non-limiting examples of realizations.

1. Unconventional Surface Coating:

A surface constructed from textured fibers shows an increase of anisotropic hydrophobicity. In FIG. 8 a comparison of surface angle between water droplet and (left) smooth polycarbonate (PC) film (right) assembled textured fibers. The contact angle depends on texture size, which can be tuned during the drawing. Fibers with novel optical properties can also be made thanks to surface textures and structures with feature sizes down to sub-wavelengths value, typically a few tens of nanometers for effects in the visible spectrum and below.

2. Control the Shape of Cell Grown on Textured-Fiber Surface

Figure 10:
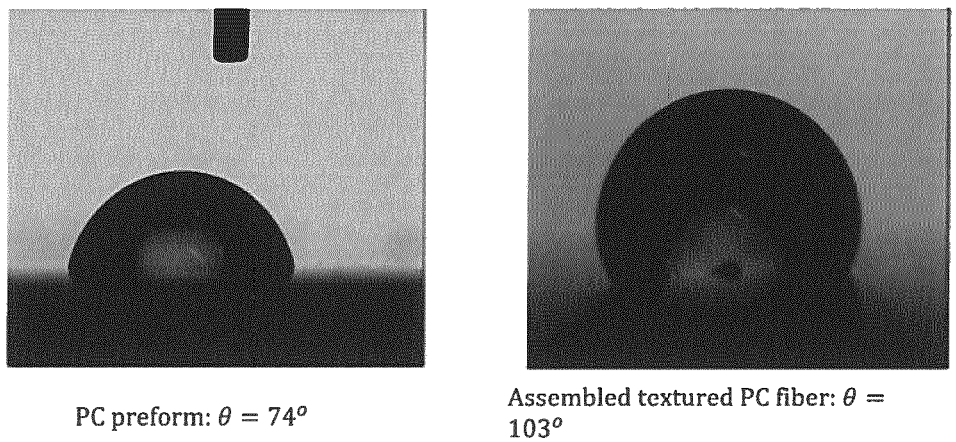
FIG. 10 illustrates a hydrophobicity enhancement of a polymer surface.

The shape of the cells grown on a surface depends on the texture underneath. A comparison of cells grown on smooth polycarbonate surface and on textured-fiber surface is shown in FIG. 10. The unidimensional-textured fiber can also guide cells along the length of the fiber. This has strong potential for regenerative scaffolds and the study of tissue engineering, nerve and cell growth in general.

3. Enhancement of a Photo-Detecting Fiber Device with Textured Surface

Figure 12:
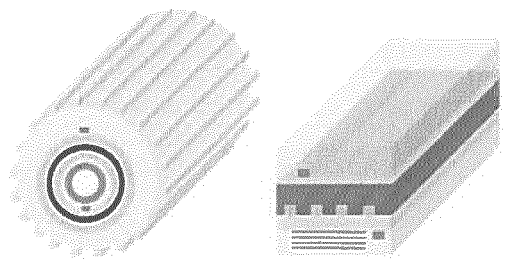
FIG. 12 illustrates two fiber configurations with outer (left) and inner (right) textures for light trapping in opto-electronic fibers.

FIG. 12 presents two designs of a textured surface of a photo-detecting fiber device. Surface textures can help the in-coupling of light inside optoelectronic fibers. In FIG. 10 we show embedded architectures that have been demonstrated in the past to allow for optoelectronic fiber devices. The grey rectangles represent metallic electrodes, the blue regions are electrically conducting polymers and the wine region are semiconducting materials[3,7], see references 3 and 7. In the configuration in the left the texture can be used as an antireflection coating to enable more light to reach the semiconductor device. In the right, the textured functional composite can be used to e-direct the light with in a thin semiconducting layer. By increasing the optical path length of the incident light, the absorption of photosensitive layer is enhanced.

4. Fibers with Freely Moving Functional Textures

Figure 11:
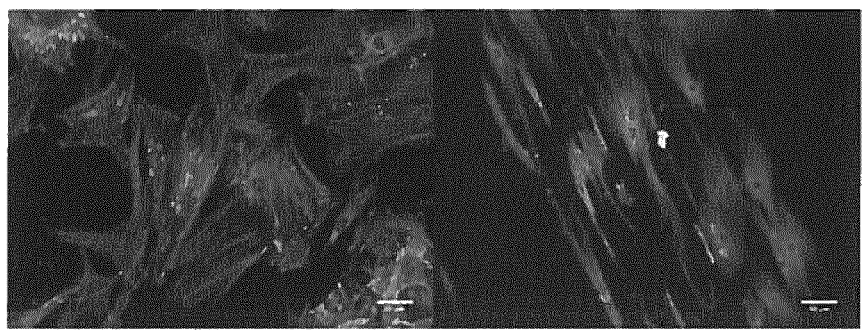
FIG. 11 illustrates alignment of stem cells on (left) flat PC surface and (right) 5 µm-surface-textured fiber.

Thus far, the opportunities associated with the integration of cantilever-like structures with freely moving functional domains within multi-material fibers have not been explored. Used extensively in the Micro-Electromechanical System (MEMS) technology, electro-mechanical transductance from moving and bendable domains is used in a myriad of applications. The control over the surface texture of fibers can also be extended to the concept of MEMS Fiber design. In FIG. 11 we show an example of that with an original cantilever-like design where a freestanding electrically conductive polymer composite film is structured so that it bends under an applied pressure. As it comes into contact with another conducting domain placed at a prescribed position in the fiber cross-section, an electrical signal is generated. Such a micro-electromechanical fiber (MEMF) can hence detect and localize pressure with high accuracy along its entire length.

Figure 13:
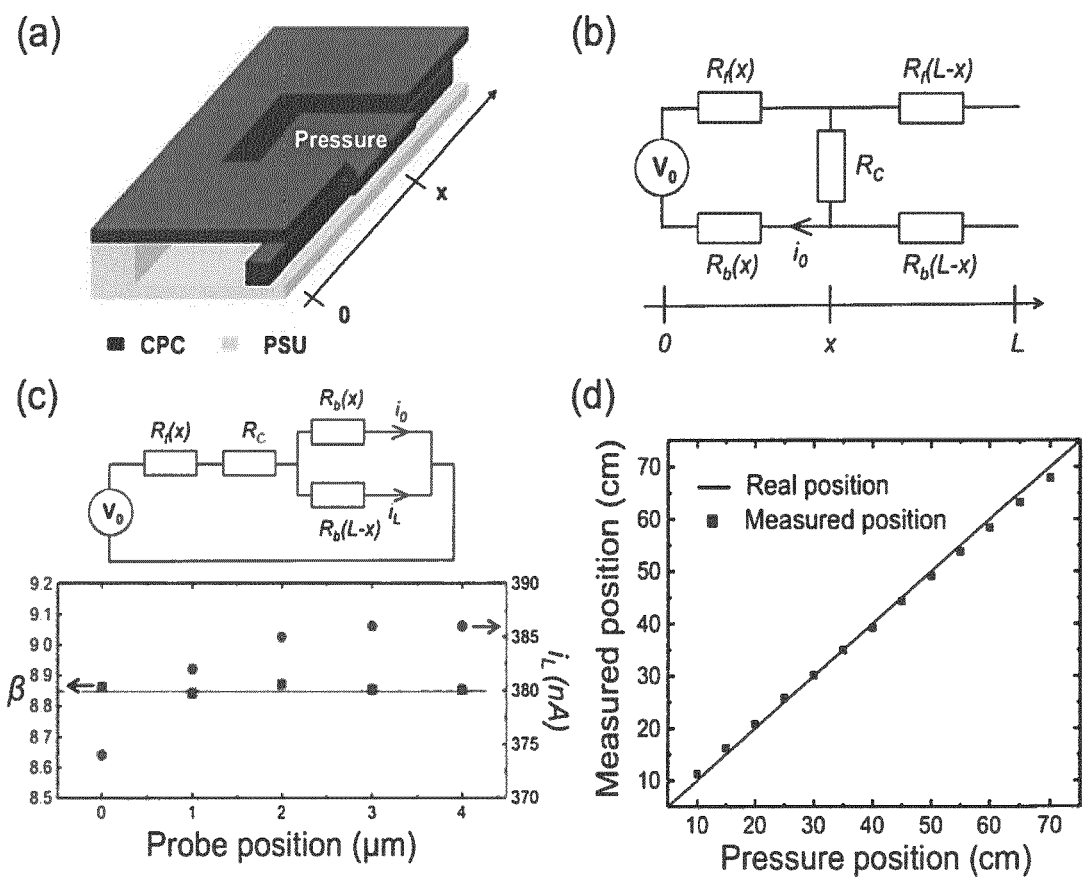
FIG. 13 illustrates the touch sensing ability based on an innovative circuitry approach along a one dimensional textured functional fiber.

FIGS. 5 and 13 illustrates an example of fabrication of a MEMF device using the fibers according to the present invention.

(a) illustrates the preform fabrication that starts with the machining of for example a polysulfone (PSU) plate in a L-shape block, the positioning and hot pressing of a conducting polymer composite such as Carbon Black loaded Polycarbonate (CPC) sheet and bus, with a Teflon domain to transfer pressure to both CPC regions, and finally a mechanical removal of Teflon.

(b) illustrates the preform-to-fiber thermal drawing.

(c) are photographs highlighting the extended length of fibers fabricated in a single draw and their flexibility.

(d) is a scanning Electron Microscopy micrograph of the cross-section of a MEMF fiber.

In FIG. 13 we show the equivalent circuit of how detection and localization can be made.

More precisely, FIG. 13 illustrates an embodiment of pressure sensing and localization using the fibers according to the present Invention:

(a) Illustrates a pressure sensing ribbon with a local pressure bending the CPC film at position x;

(b) Illustrates the equivalent circuit when a potential is applied at one fiber end and a pressure is applied at a position x along the fiber length.

(c) Top: an equivalent circuit used to localize pressure. Bottom: graph of the measured iL (in wine, scale to the right) that raises as the probe Is brought down on the MEMF device. The current ratio β is also shown (left scale) that reveals that it is independent of the pressure applied.

(d) Illustrates that measured position versus real position extracted from the measurement of β for pressures applied along a 85 cm long fiber.

When a potential difference is applied at one fiber end, one quickly realizes that the current generated will depend upon the position along the ribbon axis (x-axis in the schematic). Indeed, the conducting polymer (typically a thermoplastic loaded with fillers such as Carbon black particles) film and bus act as linear resistors and the further away from the applied potential, the higher the equivalent resistance of the circuit. If the potential is applied at a position x=0 as shown in FIG. 13$b$, the resistance of the conducting polymer (CP) top film Rf(x) and bottom bus Rb(x) are simply given by $$R_f(x) = \frac{\rho_{CPC} x}{S_f} \text{ and } R_b(x) = \frac{\rho_{CPC} x}{S_b}$$

where $\rho_{CPC}$ is the resistivity of CPC and was measured to be quite uniform along the fiber length and equal to around 1Ω·m. Sf and Sb are the cross-sectional surface area of the CP film and bus respectively. This measurement would not however be sufficient to extract both the presence and position of a pressure applied to the electro-mechanical ribbon. Depending on the pressure intensity, the contact resistance Rc between the CPC film and bus can vary. We hence propose another circuit configuration that enables to measure two different currents out of which the position can be specified regardless of the applied pressure. In FIG. 13$c$, we show the equivalent circuit for this approach where we add a connection to the CP bus at the other extremity from the applied voltage. We can measure independently the two currents flowing in parallel $i_O(x)$ and $i_L(x)$. Taking their ratio $$\beta = \frac{i_O}{i_L}$$

eliminates the unknown voltage drop (unknown because it depends on both the position x and $R_c$) and is simply given by the ratio of the two resistance $R_b(x)$ and $R_b(L-x)$. Using the expressions of $R_b$ as a function of x given above Immediately gives:

$$x = \frac{L}{1+\beta} \quad [1]$$

To verify our reasoning that the ratio β is indeed independent of the applied pressure, we plotted in the graph of FIG. 12$c$ the measured $i_L$ current and the ratio β as a function of the position of the probe that pushes down on the ribbon. At a position of 0 μm, the pressure is just high enough for the two CP domains to touch each other. As the probe is brought down and its position increases from 0 to 4 μm, a higher pressure results and hence a lower Rc, increasing the current $i_L(x,R_c)$ as seen in the graph. Measuring $i_O(x, R_c)$ at the same time and plotting the ratio β shows however that this ratio remains unchanged as the pressure is increased. The measured position x from our model is therefore only a function of the position of the applied pressure. In FIG. 13$d$ we show a plot of the measured position versus the actual position of the probe along a 85 cm long MEMF device. The straight line represent the actual position of the probe during the experiment, while the blue square are the values of the position obtained from equation [1] and the experimental measurements of the β ratio, for a length L of 85 cm. An excellent agreement is obtained, with a slight shift due to the size of the contacts at the fiber edge and the fact that they are not exactly situated at x=0 and x=L. Note that from an engineering point of view, this slight shift can be suppressed by calibrating the response of the fiber since to each pressure location is indeed associated a single β ratio. The error on the position can then only come from noise current associated with the measure.

This ability to detect and localize touch over large areas, curved surfaces and textiles holds significant opportunities in robotics and prosthetics, flexible electronic interfaces, and medical textiles. Other designs with thinner freestanding sheets, softer materials or encapsulated architectures are also under investigation, paving the way towards novel functionalities such as controlled release from partly closed cavities, or advanced functional surfaces for electronic skin applications.

All embodiments and materials described in the present application are given as examples that should not be construed in a limiting manner. Other realization and materials are possible within the frame of the present invention, for example equivalent methods and materials. Different embodiments may also be combined according to circumstances. In particular, enclosed configurations inspired by the present architectures but with a moving membranes attached to two pillars can also be fabricated.

RELATED SCIENTIFIC PUBLICATIONS

1. Kao, K. & Hockham, G. Dielectric-fibre surface waveguides for optical frequencies. *PROC. IEE.* 1151-1158 (1966). at <http://ieeexplore.ieee.org/xpls/abs_all.jsp?arnumber=5250060>
2. Russell, P. Photonic crystal fibers. *Science* 299, 358-62 (2003).
3. Abouraddy, A., Bayindir, M. & Benoit, G. Towards multimaterial multifunctional fibres that see, hear, sense and communicate. *Nat. Mater.* 6, (2007).
4. Banaei, E. & Abouraddy, A. F. Design of a polymer optical fiber luminescent solar concentrator. 403-416 (2015). doi:10.1002/pip
5. Yildirim, A., Yunusa, M., Ozturk, F. E. & Kanik, M. Surface Textured Polymer Fibers for Microfluidics. 4569-4576 (2014). doi:10.1002/adfm.201400494
6. Patty, A. R. & Zebrowski, W. S. Patented May 2, 1972. 1-6 (1972).
7 Alexander Schmidt, M., Argyros, A. & Sorin, F. Hybrid Optical Fibers—An Innovative Platform for In-Fiber Photonic Devices. *Adv. Opt. Mater.* 4, 13-36 (2016).

The invention claimed is:

1. A method for forming a textured surface on a fiber comprising the steps of:
   forming a preform with the textured surface;
   adding a protective layer to the preform to preserve a shape of the textured surface;
   drawing the fiber from the preform such that the fiber keeps the formed textured surface of the preform by virtue of the protective layer; and
   removing the protective layer to expose the textured surface to provide for a textured fiber.

2. The method as defined in claim 1, wherein the step of removing the protective layer includes at least one of a mechanical process and a chemical etching process.

3. The method as defined in claim 1, wherein the step of forming the preform, the texturing is formed by using at least one of a photolithography process, a hot-embossing process, and a solution/film casting process.

4. The method as defined in claim 1, wherein the preform is made of a polymer.

5. The method as defined in claim 4, wherein the polymer forming the preform includes at least one of a polycarbonate, a poly(methyl methacrylate) PMMA, and a polysulfone.

6. The method as defined in claim 4, wherein the polymer forming the preform is a polymer composite.

7. The method as defined in claim 1, wherein the protective layer includes a polymer.

8. The method as defined in claim 1, wherein the polymer forming the protective layer includes at least one of a polyethylene, a poly(methyl methacrylate) PMMA, and a carbon-black filled polyethylene.

9. The method as defined in claim 1, wherein the preform has a rectangular or cylindrical cross-section.

10. A method of forming a textured hollow channel in another material, comprising the steps of:
    drawing the textured fiber using the method of claim 1, and
    using the textured fiber to form the textured hollow channel in the another material.

11. The method as defined in claim 10, further comprising the step of:
    using a network of the textured fibers as a mold; and
    forming a three-dimensional microfluidic architecture with channels of predetermined shape and roughness in the another material inside the mold.

12. The method as defined in claim 10, wherein the another material includes a soft polymer.

13. The method as defined in claim 12, wherein the soft polymer includes poly(methyl methacrylate) (PDMS).

14. A method of forming a surface coating, comprising the steps of:
    drawing fibers using the method of claim 1; and
    assembling the drawn fibers to form a surface coating.

15. A method of forming a pressure detector comprising the steps of:
    drawing the textured fiber using the method of claim 1; and
    using the drawn textured fiber as a pressure detector.

16. The method as defined in claim 15, wherein the textured fiber is provided with a free standing electrically conductive polymer composite film that includes a bending structure that bends under pressure and with domains placed at defined positions on the textured fiber such that when the bent conductive polymer composite film contacts the domain, an electrical signal is generated that allows detection of the pressure localization along the textured fiber.

17. The method as defined in claim 16, where the bending structure includes a membrane that encloses the textured fiber.

18. The method as defined in claim 1, wherein the preform includes a thermoplastic rod or plate.

19. The method as defined in claim 1, wherein the textured surface includes sub-micrometer patterns.

* * * * *